United States Patent
Jungerman et al.

(10) Patent No.: US 7,206,340 B2
(45) Date of Patent: Apr. 17, 2007

(54) CHARACTERIZING JITTER OF REPETITIVE PATTERNS

(75) Inventors: Roger Lee Jungerman, Petaluma, CA (US); Marlin Viss, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 831 days.

(21) Appl. No.: 10/354,598

(22) Filed: Jan. 29, 2003

(65) Prior Publication Data
US 2004/0146097 A1 Jul. 29, 2004

(51) Int. Cl.
*H04Q 1/20* (2006.01)

(52) U.S. Cl. ..................................... 375/226

(58) Field of Classification Search ................ 375/224, 375/225, 234, 227, 254, 296, 346, 348, 371; 702/69, 190, 191; 370/516; 714/738, 742
See application file for complete search history.

(56) References Cited

U.S. PATENT DOCUMENTS

| | | | |
|---|---|---|---|
| 6,137,283 A | 10/2000 | Williams et al. | |
| 6,263,290 B1 | 7/2001 | Williams et al. | |
| 6,298,315 B1 | 10/2001 | Li et al. | |
| 6,832,172 B2 * | 12/2004 | Ward et al. | 702/69 |
| 2002/0158212 A1 * | 10/2002 | French et al. | 250/459.1 |
| 2004/0075482 A1 * | 4/2004 | Moll | 327/276 |

OTHER PUBLICATIONS

The Use Of Fast Fourier Transform For The Estimation Of Power Spectra: A Method Based On Time Averaging Of Short, Modified Periodgrams, P. D. Welch, IEEE Transactions On Audio And Electroacoustics, vol. AU-15, No. 2, Jun. 1967, pp. 70-73.
Agilent S6120C Multi-Wavelength Meter User's Guide, "Defining Laser Line Peaks", pp. 2-15 through 2-17; Agilent Technologies, Inc., Palo Alto, California.

* cited by examiner

*Primary Examiner*—Khanh Tran
*Assistant Examiner*—Sam K. Ahn
(74) *Attorney, Agent, or Firm*—John L. Imperato

(57) ABSTRACT

A method and system characterize a random component of the jitter by designating an edge in the repetitive pattern, determining a slope of the designated edge, and acquiring a set of amplitude values at a different occurrences of the designated edge. A frequency domain representation of the set of amplitude values is then obtained, and identified peaks in the frequency domain representation are truncated. An RMS value, or other measure of random variations of the truncated representation is extracted and converted, based on the slope of the designated edge, to a corresponding RMS time jitter that represents the random component of the jitter. A periodic component of the jitter is characterized by determining the peak amplitude deviation of the acquired set of amplitude values, and then determining a periodic amplitude variation based on the RMS value, the peak amplitude deviation and the number of amplitude values in the set of amplitude values. The peak amplitude deviation is then converted, based on the slope of the designated edge, to a corresponding periodic time jitter that represents the periodic component of the jitter.

20 Claims, 5 Drawing Sheets

CHARACTERIZING JITTER OF REPETITIVE PATTERNS

FIELD OF THE INVENTION

This invention relates to sampling of waveforms, and particularly, to characterizing jitter of repetitive patterns using an equivalent-time sampling system.

BACKGROUND OF THE INVENTION

The presence of jitter, a measure of time-dependent signal fluctuations, affects the integrity and reliability of a communication system, as the bit error rate of the communication system is influenced by the characteristics of the jitter. Characterizing components of the jitter, such as a random time-varying component and a periodic time-varying component, enables designers of the communication system to establish sources of the jitter and predict the bit error rate of the communication system.

One technique for characterizing jitter is disclosed by Li et al. in U.S. Pat. No. 6,298,315 B1. Li et al. separates and analyzes deterministic and random components of a jitter distribution based on a histogram representing the distribution, by fitting tail regions to the distribution defined by the histogram.

Another technique is taught by Williams et al. in U.S. Pat. No. 6,263,290 B1. Williams et al. specifies a threshold on a waveform, obtains samples that surround the threshold voltage and interpolates the samples to generate an accurate time tag list. The time tag list indicates positions in time that correspond to the point at which the waveform crosses the threshold to represent statistical properties of time-related parameters such as jitter.

SUMMARY OF THE INVENTION

A method and system constructed according to embodiments of the present invention characterize jitter of a repetitive pattern. A random component of the jitter is characterized by designating an edge in the repetitive pattern, determining a slope of the designated edge, and acquiring a set of amplitude values at a different occurrences of the designated edge. A frequency domain representation of the set of amplitude values is then obtained, and identified peaks in the frequency domain representation are truncated. An RMS value, or other measure of random variations of the truncated representation is extracted and converted, based on the slope of the designated edge, to a corresponding RMS time jitter that represents the random component of the jitter.

A periodic component of the jitter is characterized by determining the peak amplitude deviation of the acquired set of amplitude values, and then determining a periodic amplitude variation based on the RMS value, the peak amplitude deviation and the number of amplitude values in the set of amplitude values. The peak amplitude deviation is then converted, based on the slope of the designated edge, to a corresponding periodic time jitter that represents the periodic component of the jitter.

DETAILED DESCRIPTION OF THE EMBODIMENTS

Figure 1A:
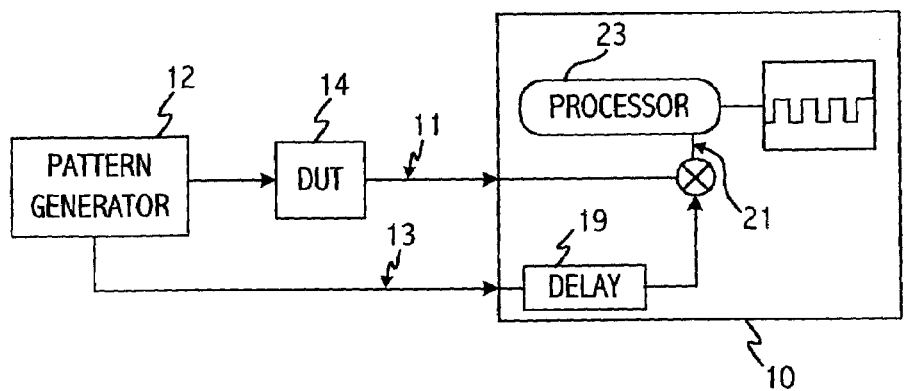
FIGS. 1A–1B show systems suitable for characterizing jitter according to embodiments of the present invention.
Figure 1B:
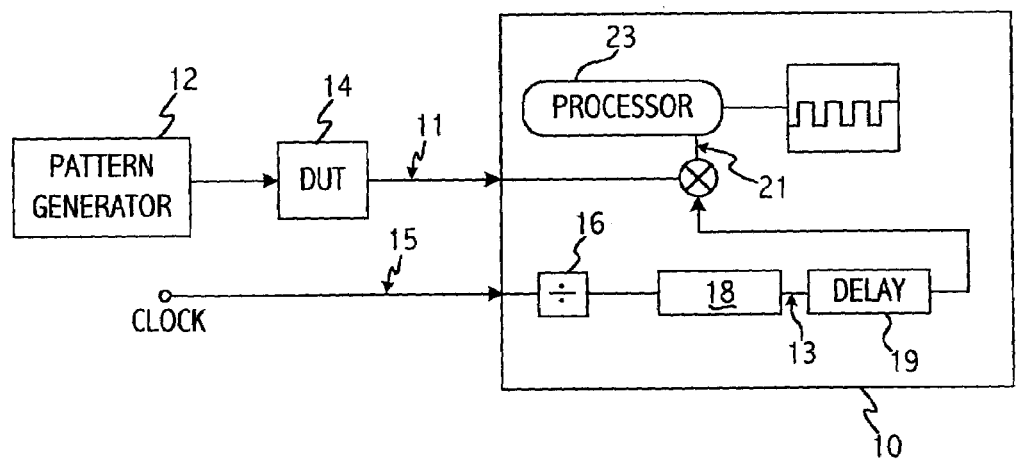

FIGS. 1A–1B show systems suitable for characterizing jitter according to embodiments of the present invention. The systems include an equivalent-time oscilloscope, digital communications analyzer (DCA) or other type of equivalent-time sampler 10 that receives a repetitive waveform or pattern 11. In this example, the repetitive pattern 11 is provided by a pattern generator 12, such as an AGILENT 81250 PARALLEL BIT ERROR RATE TESTER, via a device under test (DUT) 14. Alternatively, the repetitive pattern 11 is provided to the equivalent-time sampler 10 by a communication channel or other source (not shown). In FIG. 1A, a pattern trigger 13 is provided to the equivalent-time sampler 10 by the pattern generator 12. In FIG. 1B, the pattern trigger 13 is derived from a clock signal 15 via a prescalar 16 and a programmable counter 18 that are internal or external to the equivalent-time sampler 10. The clock signal 15 is recovered from the repetitive pattern 11 using clock recovery techniques, or the clock signal 15 is provided separately from the repetitive pattern 11 as shown.

The equivalent-time sampler 10 has an adjustable delay 19 suitable for delaying the pattern trigger 13 to control timing of sample acquisitions. A processor 23 enables the delay 19 to be adjusted and enables acquired samples 21 to be processed to characterize jitter of the repetitive pattern 11 in accordance with the embodiments of the present invention.

Figure 2:
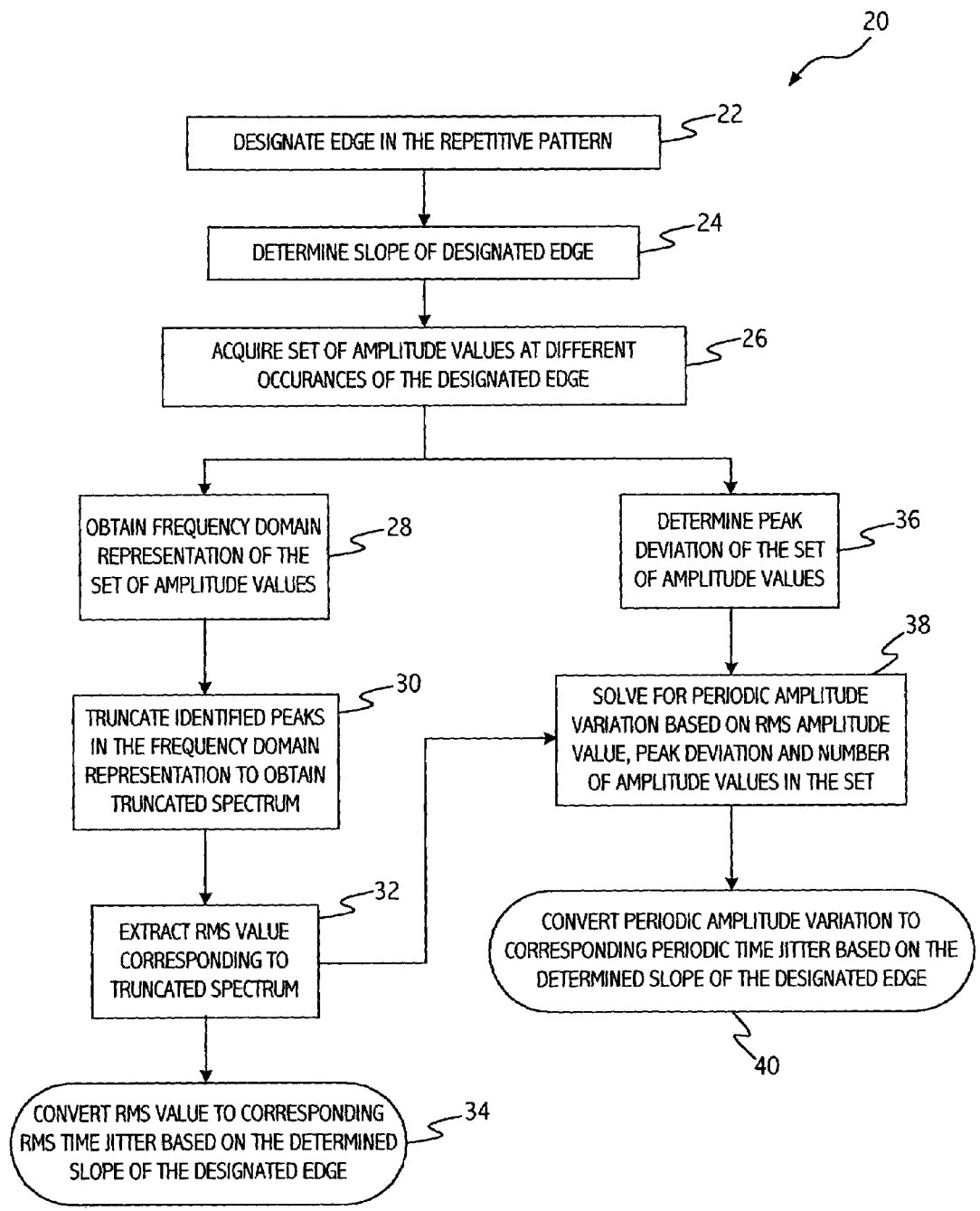
FIG. 2 is a flow diagram of a jitter characterization method according to alternative embodiments of the present invention.

FIG. 2 is a flow diagram of a jitter characterization method 20 according to embodiments of the present invention. The method 20 is suitably implemented using the systems of FIGS. 1A–1B or using any other system or instrument that acquires or otherwise provides the samples 21 of the repetitive pattern 11 and has capability to manipulate the acquired samples 21. Alternatively, a computer-readable medium is encoded with a computer program that instructs a computer to perform the method 20.

In step 22 of the method 20, an edge 25 (shown in FIG. 3A), such as a rising edge, falling edge, or other amplitude transition versus time, within the repetitive pattern 11 is designated. Designating the edge 25 typically involves pattern triggering the equivalent-time sampler 10 to acquire a sufficient number of samples 21 to reconstruct at least a portion of the repetitive pattern 11, and establishing a delay τ that positions the pattern triggering so that acquisitions of samples 21 are timed to occur on the designated edge 25.

The slope S of the designated edge 25 is determined in step 24, typically based on the acquired samples of the repetitive pattern 11 that lie on the designated edge 25, or based on the rise or fall-time of the edge 25, or other measurements or determinations of the slew-rate of the edge 25, indicated for example in volts, or other amplitude units Δv, per unit of time Δt.

Figure 3A:
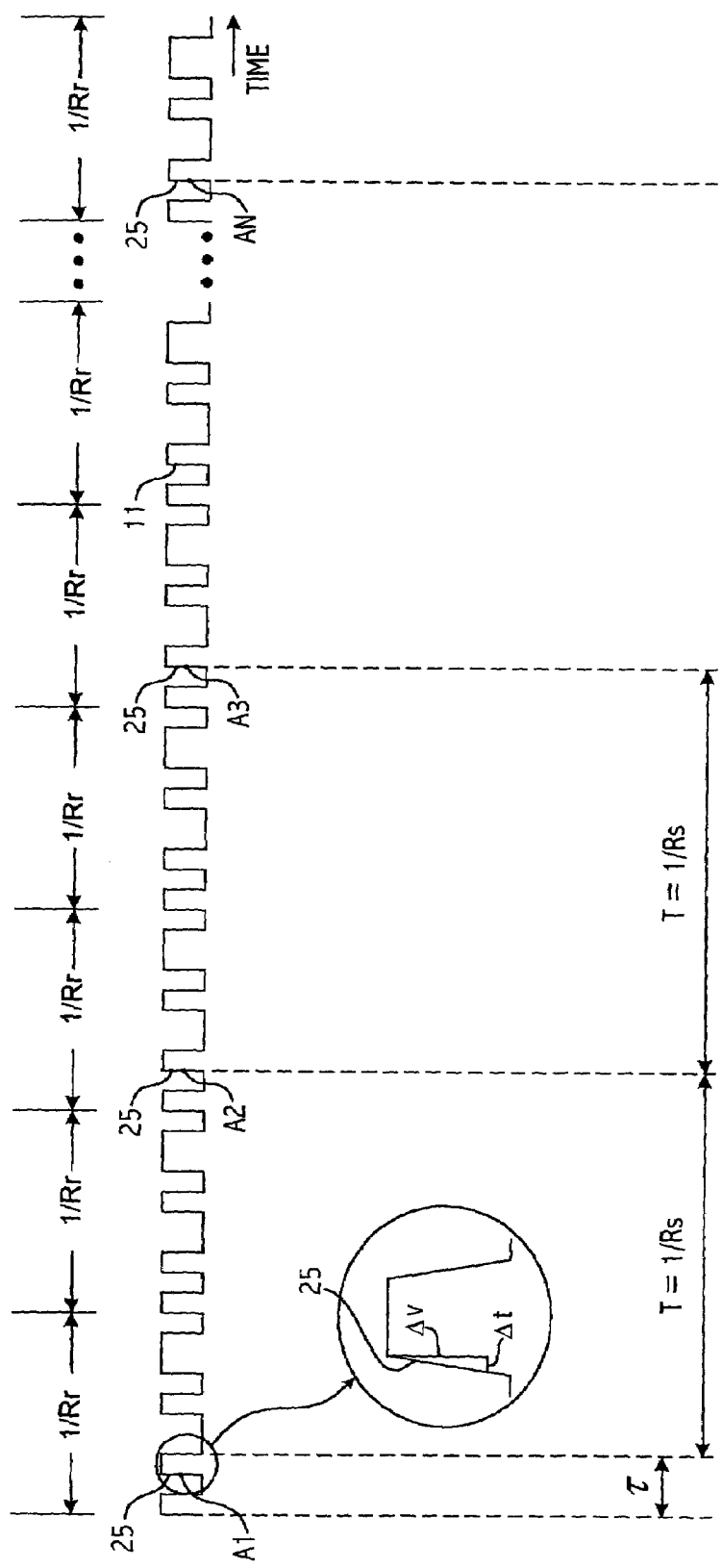
FIGS. 3A–3B show examples of a set of amplitude values acquired from a repetitive pattern for use in the jitter characterization according to the embodiments of the present invention.
Figure 3B:
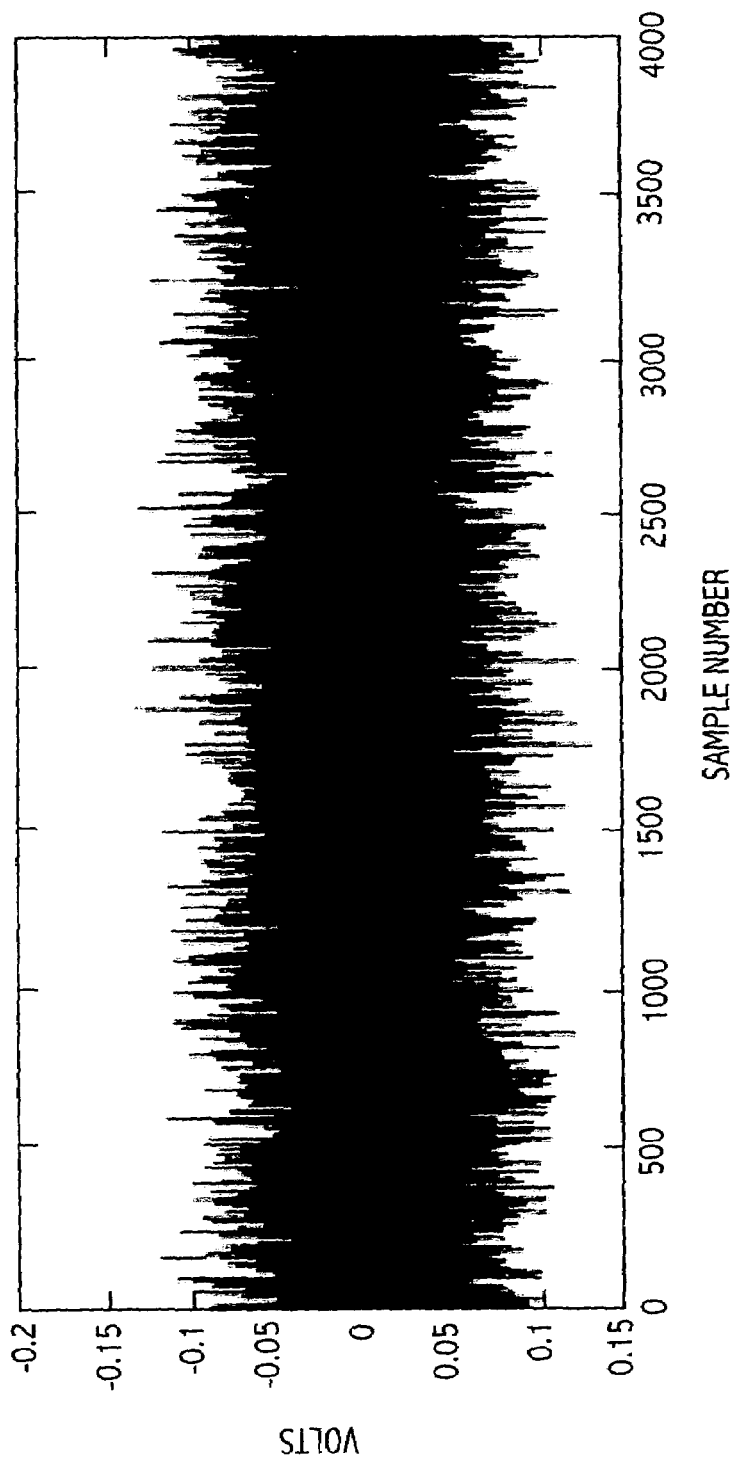

In step 26, the samples 21 are a set of amplitude values A1–AN acquired on the designated edge 25 in the repetitive pattern 11, wherein each of amplitude values A1–AN in the set is acquired at a different occurrence of the designated edge 25 in the repetitive pattern 11 as shown in FIG. 3A. The set of amplitude values A1–AN is acquired by sampling the repetitive pattern 11 at a sampling rate Rs that does not exceed the repetition rate Rr of the repetitive pattern 11, and at a delay τ of the pattern trigger 13 that positions the acquisition of each the amplitude values A1–AN at an established time position. In this example, pattern triggering results in the amplitude values A1–AN being acquired at established time positions that are equally spaced at time intervals T. Alternatively, the set of amplitude values A1–AN is acquired from a memory or other storage medium, or a simulator or other program. An example of the acquired set of amplitude values A1–AN, indicated in volts, is shown in FIG. 3B.

In step 28 of the method 20, a frequency domain representation 35 (shown in FIG. 4) of the acquired set of amplitude values A1–AN is obtained. In one example, the processor 23 performs an FFT (Fast Fourier Transform) on the amplitude values A1–AN to provide the frequency domain representation 35, although any suitable mapping from the time domain to the frequency domain can provide the frequency domain representation 35. Alternatively, the frequency domain representation 35 is provided by estimating power spectral density (PSD) corresponding to the set of amplitude values A1–AN using a method described in *The Use of Fast Fourier Transform for the Estimation of Power Spectra: A Method Based on Time Averaging of Short, Modified Periodograms*, P. D. Welch, IEEE Trans. Audio Electro., vol. AU-15, June 1967, pp. 70–73, hereby incorporated by reference, or using any other method for estimating PSD, such as the "pwelch" function in MATLAB 5.3 by THE MATHWORKS, INC., Natick, Mass.

In step 30, identified peaks P within the frequency domain representation 35 are truncated to provide a truncated spectrum. In one example, identifying peaks P in step 30 includes establishing the frequency domain representation 35 on a logarithmic scale, determining the average amplitude AVE for the frequency domain representation 35 on the logarithmic scale, and choosing a threshold TH that is above the average amplitude AVE by a predetermined amount Δ. Amplitudes in the frequency domain representation 35 that exceed the threshold TH are then truncated in accordance with step 30 to provide the truncated spectrum. Various known techniques are alternatively used to identify peaks P within the frequency domain representation 35, such as techniques described in the *AGILENT 86120C Multi-Wavelength Meter User's Guide*, page 2–15 through page 2–17, available from AGILENT TECHNOLOGIES, INC., Palo Alto, Calif.

Figure 4:
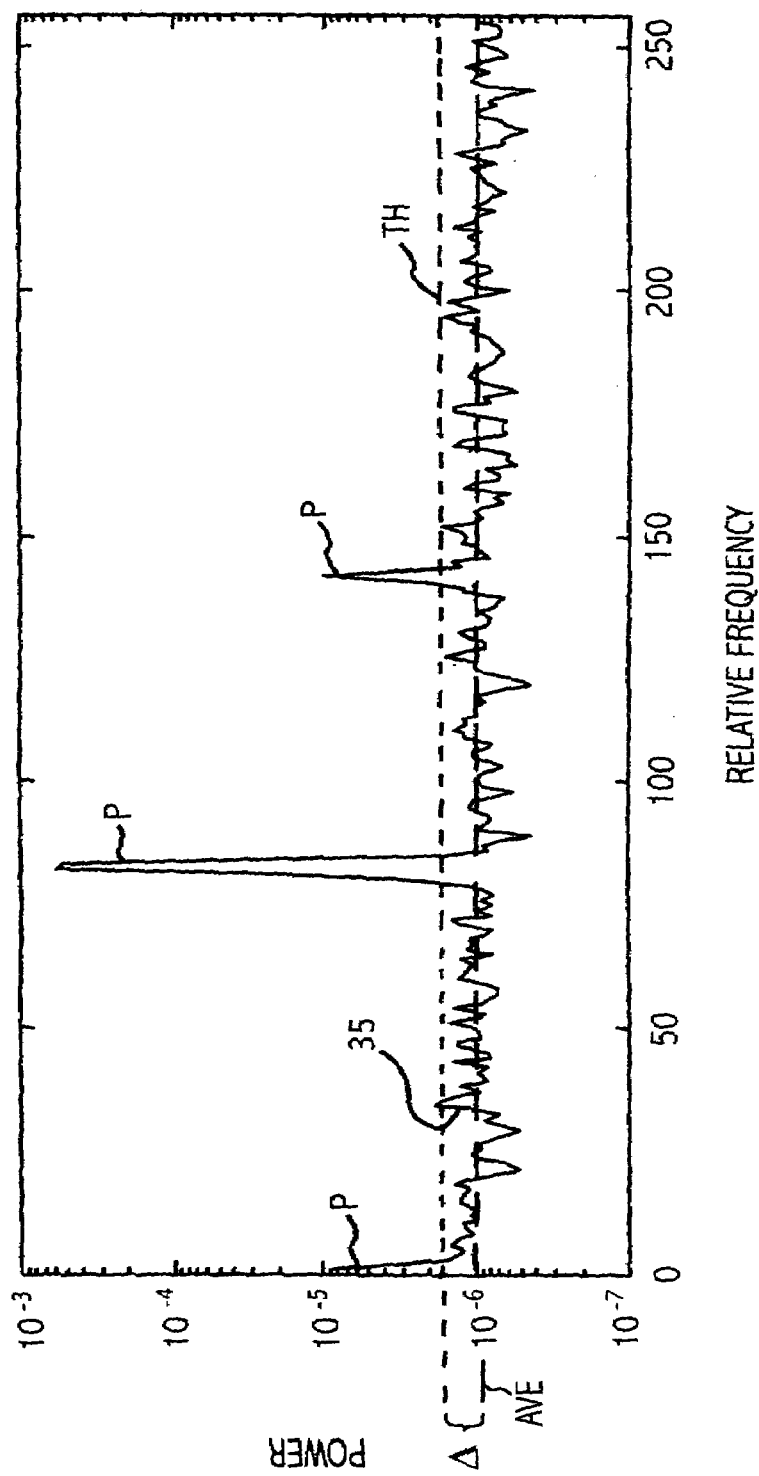
FIG. 4 shows a frequency domain representation of the acquired set of amplitude values.

In step 32 an RMS value 6 corresponding to the truncated spectrum is determined. Typically, the RMS value σ is determined by squaring each element in the truncated spectrum, summing the squares of the elements in the truncated spectrum, and taking the square root of the sum of the squares of the elements in the truncated spectrum. Alternatively, step 32 further includes taking an inverse FFT, or an inverse of the mapping from the time domain to the frequency domain used to provide the frequency domain representation 35 in step 28, to obtain a truncated time-domain representation of the amplitude values A1–AN. Then the RMS value σ is determined by squaring each element in the truncated time-domain representation of the amplitude values A1–AN, summing the squares of the elements in the truncated time-domain representation, and taking the square root of the sum of the squares of the elements in the truncated time-domain representation. When the frequency domain representation 35 is a PSD as shown in FIG. 4, then the RMS value σ is determined as the square root of the sum the elements in the PSD.

In step 34, the RMS value σ is converted to a corresponding RMS time jitter based on the determined slope S of the designated edge 25. The conversion is typically performed by dividing the RMS value σ by the slope S of the designated edge 25. In applications where the RMS value σ is used to determine periodic time jitter of the repetitive pattern 11, step 34 is optionally omitted. Step 34, when included, relates amplitude values to corresponding times via the slope S of the designated edge 25 and can be performed at any point in the method 20 following step 26. Steps 36–40 are included in the method 20 to determine periodic time jitter of the repetitive pattern 11.

In step 36, a peak deviation App of the set of amplitude values A1–AN is determined. The peak deviation App is the difference between the maximum amplitude value in the set and the minimum amplitude value in the set. In step 38, a periodic amplitude variation B is established based on the RMS value σ obtained in step 32, the peak deviation App from step 36, and the number N of amplitude values A1–AN in the set of acquired samples. The periodic amplitude variation B in this example is a peak-to-peak periodic amplitude variation, but any other representation of the periodic component of the variations of the amplitude values A1–AN is alternatively used.

Establishing the periodic amplitude variation B in step 38 involves designating the periodic component of the variation of the amplitude values A1–AN to be square-shaped, sine-shaped, or any other shape that suitably represents the nature of the periodic component of the jitter; forming a distribution having a random component, and the periodic component with the designated shape; and solving for the periodic amplitude variation B.

In one embodiment, the periodic component is designated to be square-shaped, and the distribution, designated as $h_{SQ}(x)$, is represented according to the relationship:

$$h_{SQ}(x) = \frac{N}{2\sigma\sqrt{2\pi}}\left(e^{-(x-B/2)^2/2\sigma^2} + e^{-(x+B/2)^2/2\sigma^2}\right)$$

When the periodic component of the variation of the amplitude values A1–AN is larger than the random component of the variation of the amplitude values A1–AN, the periodic amplitude variation B is correspondingly larger than the RMS value σ, and a closed-form solution for the periodic amplitude variation B is obtained according to the relationship:

$$B \approx A_{pp} - 2\sigma\sqrt{-2\ln(2\sigma\sqrt{2\pi}/N)}$$

When the random component of the variation of the amplitude values A1–AN is larger than the periodic component of the variation of the amplitude values A1–AN, the periodic amplitude variation B is correspondingly less than the RMS value σ, and a numerical solution for the periodic amplitude variation B in the equation for $h_{SQ}(x)$ is obtained. The numerical solution includes defining a function g(x)=log $(h_{SQ}(x))$ in a mathematical software package, such as MATLAB, and solving where the function g(x)=0 for x, for example using the "fzero" function provided by MATLAB. Defining the function g(x) facilitates convergence of the numerical solution for the periodic amplitude variation B. While in this example the function g(x) is a logarithmic function, any function g(x) or other technique that enables convergence of a numerical solution for the periodic amplitude variation B is alternatively employed.

In an alternative embodiment, the periodic component of the variation of the amplitude values A1–AN is designated to be sine-shaped, and the formed distribution, designated as h(x), is a numerical convolution of a random component of the variation of the amplitude values A1–AN, designated as r(x), and a sinusoidal periodic component of the variation of the amplitude values A1–AN, designated as d(x). The distribution h(x) is represented by the relationship h(x)=N*sum (d(z).*r(x-z)), where the operator.*indicates an element by element multiplication, or numerical convolution, where $d(x)=1/(\pi(B/2)^2-x^2)^{1/2}$ ), where r(x) is a guassian curve representing the random variation of the amplitude values A1–AN having the RMS value σ, and where z is an array of evenly-spaced positions between +B/2 and –B/2. A numerical solution for the periodic amplitude variation B in this example is obtained by defining a function g(x)=log(h(x)) in a mathematical software package, for example MATLAB, and solving where the function g(x)=0 for x, for example using the "fzero" function provided by MATLAB. In this example, the function g(x) facilitates convergence of the numerical solution for the periodic amplitude variation B. However, any function g(x) or any other technique that enables convergence of a numerical solution for the periodic amplitude variation B is alternatively employed.

The RMS value σ, refers to the root mean square, variance or any other indicator or measure of the random variation of the amplitude values A1–AN from which the random component of the distribution formed in step 38 can be established.

In step 40 of the method 20 the periodic amplitude variation B is converted to a corresponding periodic time jitter based on the slope S of the designated edge 25, typically by dividing the periodic amplitude variation B by the slope S of the designated edge 25.

While the embodiments of the present invention have been illustrated in detail, it should be apparent that modifications and adaptations to these embodiments may occur to one skilled in the art without departing from the scope of the present invention as set forth in the following claims.

What is claimed is:

1. A method for characterizing jitter of a repetitive pattern, comprising:
    designating an edge in the repetitive pattern;
    determining a slope of the designated edge;
    acquiring a set of amplitude values, wherein each amplitude value in the set is acquired at a different occurrence of the designated edge in the repetitive pattern;
    obtaining a frequency domain representation of the set of amplitude values;
    truncating identified peaks in the frequency domain representation to obtain a truncated representation;
    extracting a root mean square (RMS) value of the truncated representation; and
    converting the RMS value to a corresponding RMS time jitter based on the slope of the designated edge.

2. The method of claim 1 further comprising:
    determining the peak amplitude deviation of the set of amplitude values;
    determining a periodic amplitude variation based on the RMS value, the peak amplitude deviation and the number of amplitude values in the set of amplitude values; and
    converting the periodic amplitude variation to a corresponding periodic time jitter based on the slope of the designated edge.

3. The method of claim 1 wherein the designating the edge in the repetitive pattern includes pattern triggering to acquire a series of samples of a repetitive pattern at a sampling rate that does not exceed the repetition rate of the repetitive pattern, and delaying the pattern triggering to coincide with the designated edge in the repetitive pattern based on the acquired series of samples.

4. The method of claim 2 wherein the designating the edge in the repetitive pattern includes pattern triggering to acquire a series of samples of a repetitive pattern at a sampling rate that does not exceed the repetition rate of the repetitive pattern, and delaying the pattern triggering to coincide with the designated edge in the repetitive pattern based on the acquired series of samples.

5. The method of claim 2 wherein the determining the periodic amplitude variation includes designating a shape of a periodic component of the jitter of the repetitive pattern, and forming a distribution having a random component and a periodic component.

6. A method for characterizing jitter of a repetitive pattern, comprising:
    designating an edge in the repetitive pattern;
    determining a slope of the designated edge;
    acquiring a set of amplitude values, wherein each amplitude value in the set is acquired at a different occurrence of the designated edge in the repetitive pattern;
    obtaining a frequency domain representation of the set of amplitude values;
    truncating identified peaks in the frequency domain representation to obtain a truncated representation;
    extracting a root mean square (RMS) value of the truncated representation;
    determining the peak amplitude deviation of the set of amplitude values;
    determining a periodic amplitude variation based on the RMS value, the peak amplitude deviation and the number of amplitude values in the set of amplitude values; and
    converting the periodic amplitude variation to a corresponding periodic time jitter based on the slope of the designated edge.

7. The method of claim 6 wherein the designating the edge in the repetitive pattern includes pattern triggering to acquire a series of samples of a repetitive pattern at a sampling rate that does not exceed the repetition rate of the repetitive pattern, and delaying the pattern triggering to coincide with the designated edge in the repetitive pattern based on the acquired series of samples.

8. The method of claim 6 wherein the determining the periodic amplitude variation includes designating a shape of a periodic component of the jitter of the repetitive pattern, and forming a distribution having a random component and a periodic component.

9. A system for characterizing jitter of a repetitive pattern according to a pattern trigger, comprising:
    an equivalent-time sampler acquiring a set of amplitude values, wherein each amplitude value in the set is acquired at a different occurrence of a designated edge in the repetitive pattern; and
    a processor obtaining a frequency domain representation of the set of amplitude values, truncating identified peaks in the frequency domain representation to obtain a truncated representation, extracting a root mean square (RMS) value of the truncated representation, and converting the RMS value to a corresponding RMS time jitter based on the slope of the designated edge.

10. The system of claim 9 wherein the processor determines the peak amplitude deviation of the set of amplitude values, determines a periodic amplitude variation based on the RMS value, the peak amplitude deviation and the number of amplitude values in the set of amplitude values, and converts the periodic amplitude variation to a corresponding periodic time jitter based on the slope of the designated edge.

11. The system of claim 9 wherein the equivalent-time sampler acquires a series of samples of a repetitive pattern at a sampling rate that does not exceed the repetition rate of the repetitive pattern to reconstruct at least a portion of the repetitive pattern, and delays the pattern trigger to coincide with the designated edge in the repetitive pattern based on the acquired series of samples.

12. The system of claim 10 wherein the designated edge in the repetitive pattern includes is established by pattern triggering to acquire a series of samples of a repetitive pattern at a sampling rate that does not exceed the repetition rate of the repetitive pattern, and delaying the pattern triggering to coincide with the designated edge in the repetitive pattern based on the acquired series of samples.

13. The system of claim 9 wherein each amplitude value in the set is equally-spaced in time.

14. The system of claim 10 wherein each amplitude value in the set is equally-spaced in time.

15. A system for characterizing jitter of a repetitive pattern according to a pattern trigger, comprising:
an equivalent-time sampler acquiring a set of amplitude values, wherein each amplitude value in the set is acquired at a different occurrence of a designated edge in the repetitive pattern; and
a processor obtaining a frequency domain representation of the set of amplitude values, truncating identified peaks in the frequency domain representation to obtain a truncated representation, extracting a root mean square (RMS) value of the truncated representation, determining the peak amplitude deviation of the set of amplitude values, determining a periodic amplitude variation based on the RMS value, the peak amplitude deviation and the number of amplitude values in the set of amplitude values, and converting the periodic amplitude variation to a corresponding periodic time jitter based on the slope of the designated edge.

16. The method of claim 15 wherein the designated edge in the repetitive pattern is established by pattern triggering to acquire a series of samples of a repetitive pattern at a sampling rate that does not exceed the repetition rate of the repetitive pattern, and delaying the pattern triggering to coincide with the designated edge in the repetitive pattern based on the acquired series of samples.

17. The system of claim 15 wherein each amplitude value in the set is equally-spaced in time.

18. A computer-readable medium encoded with a computer program that instructs a computer to perform a method for characterizing jitter of a repetitive pattern, the method comprising:
designating an edge in the repetitive pattern;
determining a slope of the designated edge;
acquiring a set of amplitude values, wherein each amplitude value in the set is acquired at a different occurrence of the designated edge in the repetitive pattern;
obtaining a frequency domain representation of the set of amplitude values;
truncating identified peaks in the frequency domain representation to obtain a truncated representation;
extracting a root mean square (RMS) value of the truncated representation; and
converting the RMS value to a corresponding RMS time jitter based on the slope of the designated edge.

19. The computer-readable medium of claim 18 wherein the method further comprises determining the peak amplitude deviation of the set of amplitude values, determining a periodic amplitude variation based on the RMS value, the peak amplitude deviation and the number of amplitude values in the set of amplitude values, and converting the periodic amplitude variation to a corresponding periodic time jitter based on the slope of the designated edge.

20. A computer-readable medium encoded with a computer program that instructs a computer to perform a method for characterizing jitter of a repetitive pattern, the method comprising:
designating an edge in the repetitive pattern;
determining a slope of the designated edge;
acquiring a set of amplitude values, wherein each amplitude value in the set is acquired at a different occurrence of the designated edge in the repetitive pattern;
obtaining a frequency domain representation of the set of amplitude values;
truncating identified peaks in the frequency domain representation to obtain a truncated representation;
extracting a root mean square (RMS) value of the truncated representation;
determining the peak amplitude deviation of the set of amplitude values;
determining a periodic amplitude variation based on the RMS value, the peak amplitude deviation and the number of amplitude values in the set of amplitude values; and
converting the periodic amplitude variation to a corresponding periodic time jitter based on the slope of the designated edge.

* * * * *

UNITED STATES PATENT AND TRADEMARK OFFICE
CERTIFICATE OF CORRECTION

| | | |
|---|---|---|
| PATENT NO. | : 7,206,340 B2 | |
| APPLICATION NO. | : 10/354598 | |
| DATED | : April 17, 2007 | |
| INVENTOR(S) | : Jungerman et al. | |

It is certified that error appears in the above-identified patent and that said Letters Patent is hereby corrected as shown below:

On the Title page, in field (56), under "Other Publications", in column 2, line 5, after "Agilent" delete "S6120C" and insert -- 86120C --, therefor.

Signed and Sealed this

Twenty-first Day of August, 2007

JON W. DUDAS
*Director of the United States Patent and Trademark Office*